United States Patent [19]

Takemae et al.

[11] 4,387,448
[45] Jun. 7, 1983

[54] DYNAMIC SEMICONDUCTOR MEMORY DEVICE WITH DECREASED CLOCKS

[75] Inventors: Yoshihiro Takemae, Yokohama; Shigeki Nozaki, Kawasaki; Tsutomu Mezawa, Aizuwakamatsu, all of Japan

[73] Assignee: A. Aoki & Associates, Tokyo, Japan

[21] Appl. No.: 254,541

[22] Filed: Apr. 15, 1981

[30] Foreign Application Priority Data

Apr. 15, 1980 [JP] Japan .................................. 55/49438

[51] Int. Cl.$^3$ .............................................. G11C 7/00
[52] U.S. Cl. .................................................. 365/203
[58] Field of Search ................................ 365/203, 222

[56] References Cited

U.S. PATENT DOCUMENTS

| | | | |
|---|---|---|---|
| 3,838,295 | 9/1974 | Lindell | 307/238 |
| 4,061,954 | 12/1977 | Proebsting | 320/1 |
| 4,081,701 | 3/1978 | White et al. | 307/355 |
| 4,144,590 | 3/1979 | Kitagawa et al. | 365/205 |
| 4,162,416 | 7/1979 | Beecham et al. | 307/362 |
| 4,166,225 | 8/1979 | Minkov et al. | 307/355 |

FOREIGN PATENT DOCUMENTS

2758810 7/1979 Fed. Rep. of Germany .
2801255 7/1979 Fed. Rep. of Germany .
2412982 7/1979 France .

OTHER PUBLICATIONS

IBM Technical Disclosure Bulletin, vol. 17, No. 9, Feb. 1975, pp. 2582–2583, Low-Power, High-Speed Sense Latch, Chu et al.
1979 IEEE International Solid-State Circuits Conference Digest of Technical Papers, pp. 140–141, Dynamic Memories-The Design of MOS Dynamic Rams, Foss.
1980 IEEE International Solid-State Circuits Conference Digest of Technical Papers, pp. 66–67, Digital Circuit Techniques-A Stacked High Capacitor Ram, Ohta et al.

*Primary Examiner*—George G. Stellar
*Attorney, Agent, or Firm*—Staas & Halsey

[57] ABSTRACT

Disclosed is a dynamic semiconductor memory device with decreased clocks having a pull up circuit associated with a pair of bit lines. The pull up circuit comprises a pair of first switching transistors connected between a power supply line and the associated bit line, and, a pair of second switching transistors. Each gate of the second switching transistors is connected to the bit line of opposite side. The turning on or off of the second switching transistor controls the gate potential of the first switching transistor.

5 Claims, 5 Drawing Figures

DYNAMIC SEMICONDUCTOR MEMORY DEVICE WITH DECREASED CLOCKS

BACKGROUND OF THE INVENTION

The present invention relates to a dynamic semiconductor memory device with decreased clocks, and more particularly, to an improvement of a semiconductor memory device having dynamic memory cells each of which comprises one transistor and one capacitor.

In general, a dynamic semiconductor memory device comprises a number of memory cells arranged in an array or matrix comprising of intersecting word lines and bit lines. Each of the bit lines is associated with a sense amplifier. Each of the memory cells connected to one sense amplifier comprises one transistor and one capacitance. During a precharge period, a bit line is charged to $V_{CC}$ (power supply voltage). In a reading operation, the sense amplifier amplifies the stored charge signal so as to be read out. After the reading operation, a dynamic restore operation is effected by charging the capacitance with charges on the bit line.

A cross reference in this field is: IEEE JOURNAL OF SOLID-STATE CIRCUITS, VOL. SC-15, No. 5, October 1980, pp 831–839, "A High Performance Sense Amplifier for a 5 V Dynamic RAM".

In an example of the prior-art devices, there is known a dynamic semiconductor memory device in which a pull up circuit for charging up each bit line after the reading operation is not included. The problem in this conventional device is that, after the reading operation, charges on each bit line have leaked out through the associated sense amplifier or due to a junction leak that lowers the potential of the bit line so that the dynamic restore operation is not sufficiently effected, as hereinafter described in detail. Since charges are not sufficiently restored in the cell capacitance, there are the disadvantages of low tolerance against soft errors which have been taken into consideration in recent years, or of the common occurrence of restore errors.

In another example of a known dynamic semiconductor memory device, a pull up circuit is associated with each bit line so that each bit line is charged up after the reading operation. In this second conventional example, the above mentioned problem of an insufficient restore operation is eliminated. However, since a number of clock signals must be applied to many points of the dynamic semiconductor memory device of this second conventional example, difficulties occur in setting the potential levels of these clock signals, or in determining the timings of these clock signals to be applied.

SUMMARY OF THE INVENTION

Accordingly, an object of the present invention is to provide a dynamic semiconductor memory device in which the number of clock signals are decreased.

Another object of the present invention is to provide a dynamic semiconductor memory device in which each pull up circuit operates with a decreased number of clock signals.

Still another object of the present invention is to provide a dynamic semiconductor memory device in which the operation of each pull up circuit depends on the situation of a sense amplifier.

A still further object of the present invention is to provide a dynamic semiconductor memory device in which the potential levels of the clock signals can be easily determined.

A still further object of the present invention is to provide a dynamic semiconductor memory device in which the timings of the clock signals to be applied can be easily determined.

According to the present invention, there is provided a dynamic semiconductor memory device including a plurality of dynamic memory cells arranged in a matrix and a sense amplifier associated with a pair of the bit lines. In addition a pull up circuit is included associated with each of the bit lines for charging up the associated bit line. The pull up circuit includes: a pair of first switching transistors respectively connected between a power supply line and the associated bit lines, for charging up the bit lines; and a pair of second switching transistors respectively connected between the gates of the pair of first switching transistors and the ground side of the sense amplifier, each gate of the pair of second switching transistors being connected to the bit line of the opposite side or non-associated bit line.

The pair of second switching transistors may alternatively be connected respectively between the gates of the pair of first switching transistors and the associated bit lines.

BRIEF DESCRIPTION OF THE DRAWINGS

These and other objects and advantages of the present invention may best be understood by reference to the following description of the preferred embodiments, when read in conjunction with the accompanying drawings, in which like reference characters designate the same or similar parts throughout the figures thereof.

DESCRIPTION OF THE PREFERRED EMBODIMENT

Before describing the preferred embodiment of the present invention, two examples of the conventional dynamic semiconductor memory devices will first be explained.

Figure 1:
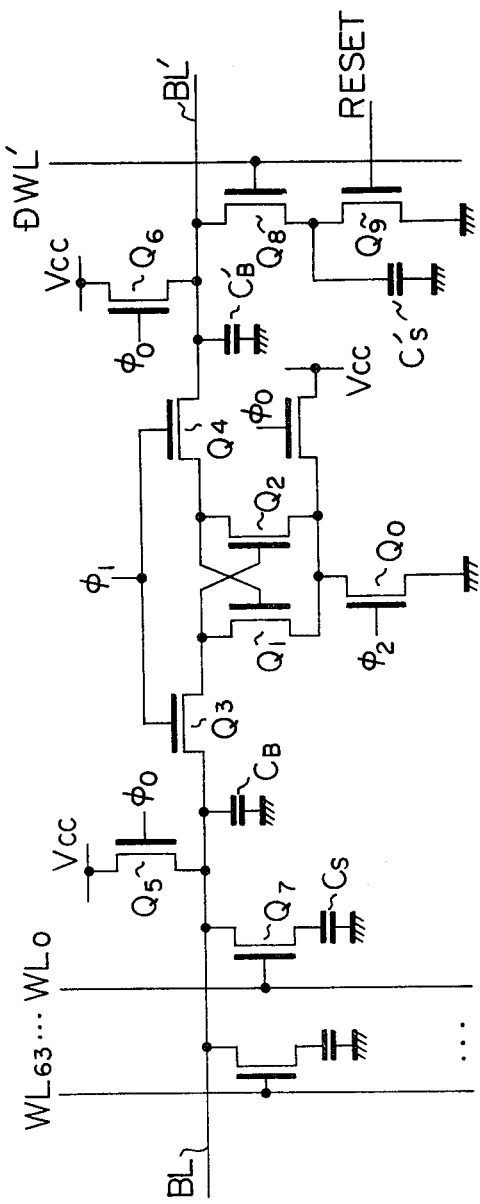
FIG. 1 is a circuit diagram illustrating a part of a conventional dynamic semiconductor memory device having no pull up circuit.

FIG. 1 is a circuit diagram illustrating a part of the first example of the conventional devices. Referring to FIG. 1, $Q_0$, $Q_1$, ..., and $Q_9$ represent transistors; BL and BL' represent bit lines; $C_S$ and $C_S'$ represent memory capacitors; $C_B$ and $C_B'$ represent capacitors of the bit lines BL and BL', respectively; $V_{CC}$ represents a power supply line or a power supply voltage; and $\phi_0$, $\phi_1$ and $\phi_2$ represent clock signals.

The drain (or source) of the transistor $Q_1$ is connected to the gate of the transistor $Q_2$. Also, the drain (or source) of the transistor $Q_2$ is connected to the gate of the transistor $Q_1$. Thus, the transistors $Q_1$ and $Q_2$ are cross connected to comprise a sense amplifier. The transistor $Q_0$ acts as a transfer gate to connect or disconnect the sense amplifier to or from the ground depending on whether the clock signal $\phi_2$ of the $V_{CC}$ level is applied or not, respectively, to the gate of the transistor $Q_0$. The transistors $Q_3$ and $Q_4$ act as transfer gates to connect or disconnect the sense amplifier to or from the bit lines BL and BL', respectively, depending on whether the clock signal $\phi_1$ having a level higher than $V_{CC}$ plus VTH, where VTH is the threshold voltage of the transistors $Q_3$ and $Q_4$, is applied or not, respectively, to the gates of the transistors $Q_3$ and $Q_4$. The transistors $Q_5$ and $Q_6$ act as switching transistors for connecting or disconnecting the power supply line $V_{CC}$ to or from the bit lines BL and BL', respectively. Also, the transistors $Q_7$ and $Q_8$ act as transfer gates for charges stored or to be stored in the memory capacitors $C_S$ and $C_S'$, respectively. On the left-hand side in FIG. 1, the transistor $Q_7$ having a gate connected to a word line $WL_0$, and the memory capacitor $C_S$ constitute a real memory cell. On the right-hand side in FIG. 1, the transistor $Q_8$ having a gate connected to a dummy word line DWL', and the memory capacitor $C_S'$ constitute a dummy memory cell. The transistor $Q_9$ connected between the source (or drain) of the transistor $Q_8$ and the ground is a switching transistor for connecting or disconnecting the source (or drain) of the transistor $Q_8$ to or from the ground. The gate of the transistor $Q_7$ in the real memory cell is connected to the word line $WL_0$. There are a number of word lines, and in this example, there are word lines $WL_0$ through $WL_{63}$ which intersect the bit line BL. Each word line is associated with one memory cell connected to the bit line BL. Therefore, there are a number of memory cells associated with the bit line BL. Only one dummy memory cell is shown connected to the bit line BL'. Also, there are a number of other word lines intersecting the bit line BL, each of which being associated with one memory cell (not shown) connected to the bit line BL, and another dummy word line intersecting the bit line BL', the dummy word line being associated with another dummy memory cell (not shown), although these word lines and the dummy word lines are not illustrated in FIG. 1 for the sake of simplicity.

The operation of the circuit of FIG. 1 will be briefly explained as follows.

There is no problem in the restore operation after information "0" has been read from a memory cell. Therefore, in the following description, let it be assumed that the original information stored in the capacitor $C_s$ is "1".

During the precharge period, the dummy memory capacitor $C_S'$ stores information "0" by using a reset signal RESET to ensure charges in the dummy memory capacitor $C_S'$ flow through the transistor $Q_9$ to the ground.

During the reading period, the sense amplifier amplifies the potential difference between the bit lines BL and BL'. The potential difference is caused by the difference between currents being conducted from the bit line BL through the transistor $Q_7$ into the memory capacitor $C_S$ and currents being conducted from the bit line BL' through the transistor $Q_8$ into the dummy memory capacitor $C_S'$.

After the reading operation, the restore operation is effected to keep the originally stored information, unless new information is to be written. When the originally stored information is "1", the restore operation is effected by conducting charges, precharged in the capacitance $C_B$ of the bit line BL, into the memory capacitor $C_S$.

However, during the time the sense amplifier is being operated, a part of the charges stored in the capacitance $C_B$ of the bit line BL leak through the sense amplifier, resulting in the potential of the bit line BL being lowered. Therefore, charges restored from the bit line BL to the memory capacitor $C_S$ tend to be insufficient to keep the originally stored information. As a result, by using the circuit of FIG. 1, there are the disadvantages of low tolerance against soft errors or of the common occurrence of restore errors. Particularly, recent dynamic semiconductor memory devices tend to employ a 5 V-only operation. In a 5 V-only operation, the above mentioned problems with respect to the circuit of FIG. 1 become more serious.

Figure 2:
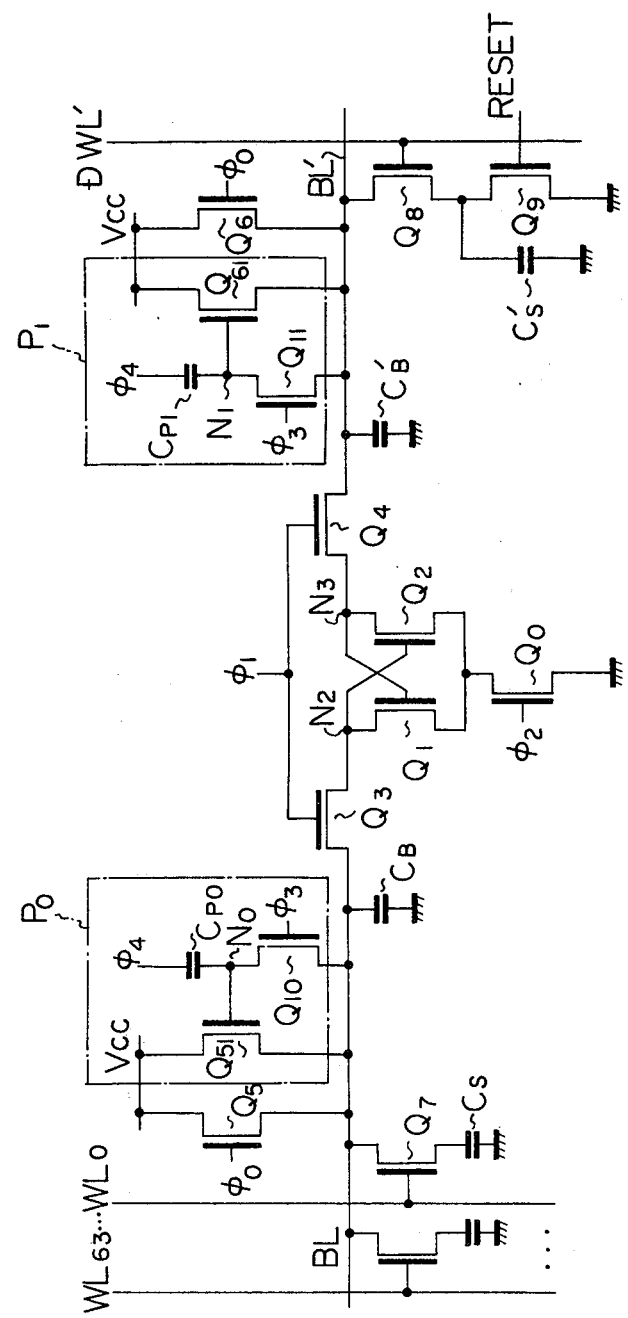
FIG. 2 is a circuit diagram illustrating a part of another conventional dynamic semiconductor memory device having pull up circuits.

In order to overcome the above disadvantages of the circuit of FIG. 1, a second example of a conventional device has been proposed. FIG. 2 is a circuit diagram illustrating a part of the second example of a conventional device. The main difference between the circuits of FIGS. 1 and 2 is that, in FIG. 2, pull up circuits $P_0$ and $P_1$ are associated on both sides of the sense amplifier. The other portions are quite similar to each other. The pull up circuit $P_0$ associated to the bit line BL comprises a transistor $Q_{51}$ connected between the power supply line $V_{CC}$ and the bit line BL, a transistor $Q_{10}$ connected between the gate of the transistor $Q_{51}$ and the bit line BL, and a capacitor $C_{P0}$ having one end is connected to the gate of the transistor $Q_{51}$. The pull up circuit $P_1$ associated with the bit line BL' also comprises transistors $Q_{61}$ and $Q_{11}$ and a capacitor $C_{P1}$ connected in the same configuration as the pull up circuit $P_0$. The clock signals $\phi_0$, $\phi_1$ and $\phi_2$ are applied to the gates of the transistors $Q_5$ and $Q_6$, to the gates of the transistors $Q_3$ and $Q_4$ and to the gate of the transistor $Q_0$, respectively, in the same manner as in the circuit of FIG. 1. In the pull up circuit $P_0$, additional clock signals $\phi_3$ and $\phi_4$ are applied to the gate of the transistors $Q_{10}$ and to the other end of the capacitor $C_{P0}$, respectively. Also, in the pull up circuit $P_1$, these signals $\phi_3$ and $\phi_4$ are applied to the gate of the transistor $Q_{11}$ and to the end of the capacitor $C_{P1}$, respectively.

Figure 3:
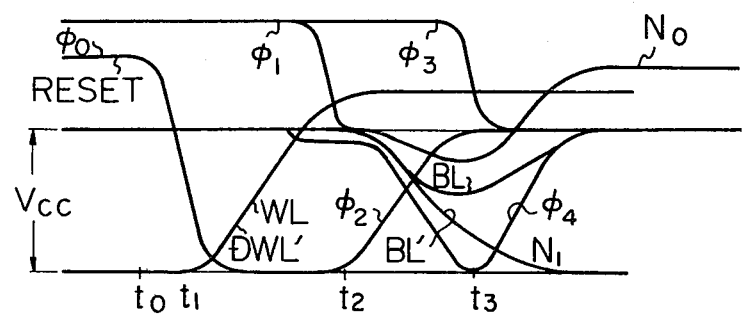
FIG. 3 is a time chart illustrating waveforms for the circuit of FIG. 2.

FIG. 3 is a time chart illustrating waveforms for the circuit of FIG. 2. Referring to FIG. 3, the waveforms of the potentials of the clock signals $\phi_0$, $\phi_1$, $\phi_2$, $\phi_3$ and $\phi_4$ of the reset signal RESET, of the word line $WL_0$, of the dummy word line DWL', of the bit lines BL and BL', and of nodes $N_0$ and $N_1$ connected to the gates of the transistors $Q_{51}$ and $Q_{61}$, respectively, are illustrated. The precharge period is that time before a time $t_0$ when the clock signal $\phi_0$ and the reset signal RESET are turned to low. During this precharge period, the bit lines BL and BL' are charged up to the $V_{CC}$ level through the transistors $Q_5$ and $Q_6$, respectively. After the time $t_0$, at a time $t_1$, the word line $WL_0$ and the dummy word line DWL' begin to rise. Then, the potential of the bit line BL' begins to fall slightly due to the fact that the charges on the bit line BL' begin to flow through the transistor $Q_8$ into the dummy capacitor $C_S'$ which has been storing no charge. However, since the capacitor $C_S$ has been storing information "1", no charge flows through the transistor $Q_7$ and therefore, the potential of the bit line BL does not fall. After this, at a time $t_2$, the clock signal $\phi_1$ is lowered to the $V_{CC}$ level so that the transistors $Q_3$ and $Q_4$ are turned off. After the transistors $Q_3$ and $Q_4$ are turned off, the clock signal $\phi_2$ is raised so that the transistor $Q_0$ is turned on. At this time, since the potential at node $N_2$ connected to the bit line BL through the transistor $Q_3$ is higher than the potential at node $N_2$ connected to the bit line $BL'$ through the transistor $Q_4$, current conducting through the transistor $Q_2$ is larger than that conducting through the transistor $Q_1$. Thus, the transistors $Q_1$ and $Q_2$ are fixed to their off and on states, respectively. The reading operation is thus completed. Since the charges on the node $N_3$ pass through the transistors $Q_2$ and $Q_0$ to the ground, the potential at the node $N_3$ is lowered to zero volts. Therefore, when the voltage between the gate of the transistor $Q_4$ and the node $N_3$ becomes larger than its threshold voltage, the transistor $Q_4$ is turned on again, and charges on the bit line $BL'$ flow through the transistors $Q_4$, $Q_2$ and $Q_0$ to the ground. Then, at a time $t_3$, when the clock signal $\phi_3$ falls to the $V_{CC}$ level and the clock signal $\phi_4$ rises to the $V_{CC}$ level, the restore operation begins. In the restore operation, the transistor $Q_{10}$ is turned to a cut off state, and thus the node $N_0$ is boosted by the clock signal $\phi_4$ through the capacitor $C_{P0}$ to ensure that the potential at the node $N_0$ goes higher than the threshold voltage of the transistor $Q_{51}$ plus the $V_{CC}$ to turn it on. Thus, during the restore operation, the power supply voltage $V_{CC}$ is applied through the transistor $Q_{51}$ to the bit line $BL$. However, the transistor $Q_{11}$ in the pull up circuit $P_1$ is kept at its on state even after the clock signal $\phi_3$ falls to the $V_{CC}$ level because the potential of the bit line $BL'$ has been greatly reduced. Therefore, charges on the node $N_1$ are conducted through the transistors $Q_{11}$, $Q_4$, $Q_2$ and $Q_0$ to the ground. Accordingly, the potentials of the node $N_1$ and the bit line $BL'$ go low as illustrated. By using the circuit of FIG. 2, since the potential of the bit line $BL$ is charged up to the $V_{CC}$ level by the clock signal $\phi_4$ through the transistor $Q_{51}$ a predetermined time after the clock signal $\phi_0$ is turned to zero, sufficient charges are restored into the memory capacitor $C_S$. In contrast to this, by using the circuit of FIG. 1, the transistor $Q_5$ is in a cut off state after the clock signal $\phi_0$ is turned to zero, so that the potential of the bit line $BL$ goes low due to junction leakage or leakage of the current through the sense amplifier.

The circuit of FIG. 2 has, however, a disadvantage in that it requires a number of types of clock signals. Particularly, it is difficult to set the timing and potential levels of the clock signal $\phi_3$ to be applied.

Figure 4:
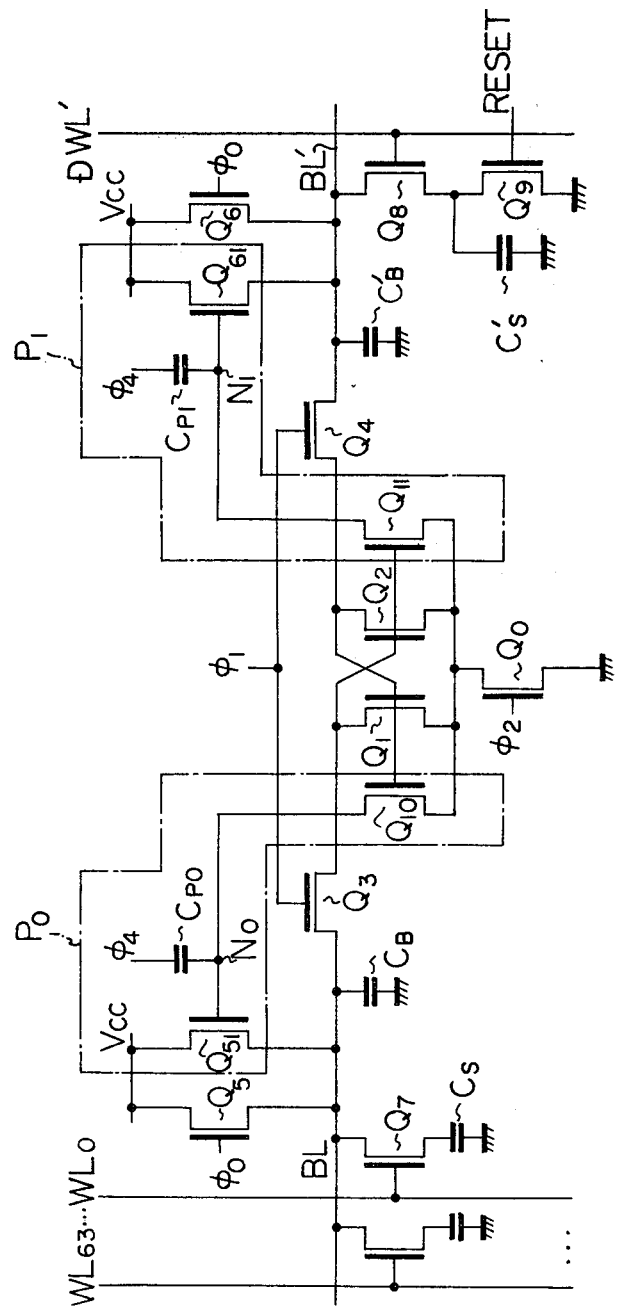
FIG. 4 is a circuit diagram illustrating a part of a dynamic semiconductor memory device according to an embodiment of the present invention.

Now, a preferred embodiment according to the present invention will be explained in detail in conjunction with FIGS. 4 and 5. FIG. 4 is a circuit diagram illustrating a part of a dynamic semiconductor memory device according to an embodiment of the present invention. The main difference between this circuit of FIG. 4 and the conventional circuit of FIG. 2 resides in the circuit configuration of the pull up circuits $P_0$ and $P_1$. In the circuit of FIG. 4, the drain (or the source) of the transistor $Q_{10}$ is connected to the node $N_0$ to which are connected the gate of the switching transistor $Q_{51}$, which is used to charge up the bit line $BL$, and one end of the capacitor $C_{P0}$, which connections are the same as those in the circuit of FIG. 2. However, the source (or the drain) of the transistor $Q_{10}$ in FIG. 4 is connected to the ground side of the sense amplifier, that is, to the sources (or the drains) of the transistors $Q_1$ and $Q_2$, instead of being connected to the bit line $BL$, as was the case in FIG. 2. Also, the gate of the transistor $Q_{10}$ is connected to the gate of the transistor $Q_1$ in the sense amplifier, instead of being connected to the clock signal $\phi_3$. Similarly, in the pull up circuit $P_1$ on the right-hand side of FIG. 4, the drain (or the source) of the transistor $Q_{11}$ is connected to the node $N_1$ to which are connected the gate of the switching transistor $Q_{61}$, which is used to charge up the bit line $BL'$, and one end of the capacitor $C_{P1}$, as was the case in the circuit of FIG. 2; the source (or the drain) of the transistor $Q_{11}$ is connected to the ground side of the sense amplifier; and the gate of the transistor $Q_{11}$ is connected to the gate of the transistor $Q_2$. Thus, in FIG. 4, the clock signal $\phi_3$ is unnecessary and does not appear. The other portions are quite the same as those in the circuit of FIG. 2, and therefore, are not described here. Instead of being connected to the ground side of the sense amplifier as illustrated in FIG. 4, the sources of the transistors $Q_{10}$ and $Q_{11}$ may be connected to the bit lines as shown in FIG. 2, without departing from the scope of the invention.

Figure 5:
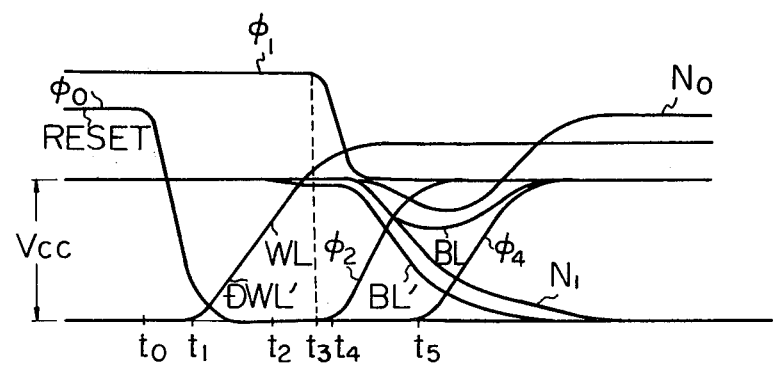
FIG. 5 is a time chart illustrating waveforms for the circuit of FIG. 4.

FIG. 5 is a time chart illustrating waveforms for the circuit of FIG. 4. Referring to FIGS. 4 and 5, the operation of the circuit of FIG. 4 will now be explained. Before a time $t_0$, the clock signal $\phi_0$ and the reset signal RESET are higher than $V_{CC}$ plus $V_{TH}$ so that the transistors $Q_5$, $Q_6$ and $Q_9$ are kept in the on states. Thus, the capacitors $C_B$ and $C_B'$ of the bit lines $BL$ and $BL'$, respectively, are charged up to the $V_{CC}$ level. Charges stored in the dummy memory capacitor $C_S'$ flow through transistor $Q_9$ to the ground. At a time $t_1$, the word line $WL_0$ and the dummy word line $DWL'$ are selected to begin to rise. At a time $t_2$, the bit line $BL'$ begins to fall slightly because charges in the capacitor $C_B'$ of the bit line $BL'$ begin to flow through the transistor $Q_8$ into the dummy memory capacitor $C_S'$, while the potential of the bit line $BL$ on the real cell side is not changed because of the real memory capacitor $C_S$ storing information "1". At a time $t_3$, the clock signal $\phi_1$ is turned from a higher level (higher than $V_{CC}+V_{TH}$) to the $V_{CC}$ level, so as to ensure that the transfer gate transistors $Q_3$ and $Q_4$ are turned off. Then, slightly later, at a time $t_4$, the clock signal $\phi_2$ begins to rise, so that the sense amplifier operates to amplify the slight potential difference between the bit lines $BL$ and $BL'$. Thus, the transistor $Q_2$ is directed to its on state and the transistor $Q_1$ is directed to its off state. Therefore, the potential difference between the bit lines $BL$ and $BL'$ is increased. Both of the potentials of the bit lines $BL$ and $BL'$ begins to be lowered due to junction leakage or leakage of the current through the transistors $Q_0$, $Q_1$ and $Q_2$, and at a time $t_5$, the clock signal $\phi_4$ beings to rise. Since the transistor $Q_{10}$ in the pull up circuit $P_0$ is in its cut off state, because a lower potential is being applied to its gate, the node $N_0$ is boosted to a higher level than $V_{CC}$. While, since the transistor $Q_{11}$ in the pull up circuit $P_1$ is in its on state, because a higher potential is being applied to its gate, charges on the node $N_1$ flow through the transistors $Q_{11}$ and $Q_0$ to the ground. As a result, the transistor $Q_{51}$ is turned on to ensure that the potential of the bit line $BL$ is charged up by charges from $V_{CC}$ through the transistor $Q_{51}$. Thus, the memory capacitor $C_S$ is sufficiently restored by charges stored in the capacitor $C_B$ of the bit line $BL$ through the transistor $Q_7$.

Since the turning on or off of the transistors $Q_{10}$ and $Q_{11}$ is effected depending on the operation of the sense amplifier, as described above, the clock signal $\phi_3$ is not necessary in this embodiment of the present invention.

From the foregoing description, it will be apparent that, according to the present invention, since the transistors for determining whether or not to activate a pull up circuit, included in a dynamic semiconductor memory device, are controlled by the potential level of the bit lines connected to both sides of a sense amplifier, and are not controlled by another clock signal, the problems in setting the potential levels and in determining the timings of the clock signals to be applied are easily solved. Further, the whole design of the dynamic semiconductor memory device is greatly simplified.

It wil be apparent that many modifications and variations may be effected without departing from the scope of the novel concept of this invention.

We claim:

1. A dynamic semiconductor memory device comprising:
    a memory cell;
    a bit line operatively connected to said memory cell;
    a sense amplifier having a first input operatively connected to said bit line, having a second input and having a ground side input; and
    a pull up circuit, operatively connected to said bit line and said sense amplifier, including:
    a capacitor;
    a first switching transistor operatively connected between a power supply and said bit line and having a gate operatively connected to said capacitor; and
    a second switching transistor operatively connected between the gate of said first switching transistor and the ground side input of said sense amplifier, operatively connected to said capacitor and having a gate operatively connected to the second input of said sense amplifier.

2. A dynamic semiconductor memory device as claimed in claim 1, wherein said dynamic semiconductor memory device is operatively connectable to receive a clock signal and wherein said capacitor is operatively connectable to receive the clock signal.

3. A dynamic semiconductor memory device comprising:
    a plurality of dynamic memory cells arranged in a matrix and divided into two groups;
    a pair of bit lines, each of which is operatively connected to a different group of said plurality of dynamic memory cells;
    a sense amplifier operatively connected to said pair of bit lines and having a ground side; and
    a pull up circuit, operatively connected to said pair of bit lines, for charging up said pair of bit lines;
    said pull up circuit comprising:
    a pair of capacitors each associated with one of said pair of bit lines;
    a pair of first switching transistors, respectively connected between a power supply line and said pair of bit lines, for charging up said pair of bit lines, each of the transistors of said pair of first switching transistors having a gate, operatively connected to a respective one of said pair of capacitors, and being associated with one of said pair of bit lines; and
    a pair of second switching transistors, respectively connected between the gates of said pair of first switching transistors and the ground side of said sense amplifier, and each operatively connected to a respective one of said pair of capacitors, for respectively controlling the gate potentials of said pair of first switching transistors, each of the transistors of said pair of second switching transistors having a gate and being associated with the same one of said pair of bit lines as the first switching transistor connected thereto, each gate of said pair of second switching transistors being connected to the non-associated bit line.

4. A dynamic semiconductor memory device as claimed in claim 3, wherein said dynamic memory device is operatively connected to receive a clock signal, wherein each of said pair of capacitors comprises first and second electrodes, each of said first electrodes being connected to the gate of one of said pair of first switching transistors, and each of said second electrodes operatively connectable to receive the clock signal.

5. A dynamic semiconductor memory device as claimed in claim 4, wherein one of the transistors said pair of first switching transistors is operatively connected to one of the bit lines of said pair of bit lines, and one of said second switching transistors, the gate of which is connected to the non-associated bit line of said pair of bit lines, said first and second switching transistors being turned on and off, respectively, for charging up the associated bit line, when said clock signal is received.

* * * * *

UNITED STATES PATENT AND TRADEMARK OFFICE
CERTIFICATE OF CORRECTION

PATENT NO. : 4,387,448
DATED : June 7, 1983
INVENTOR(S) : Yoshihiro Takemae et al It is certified that error appears in the above-identified patent and that said Letters Patent is hereby corrected as shown below:

Front page, [73] Assignee: "A. Aoki & Associates, Tokyo" should be --Fujitsu Limited, Kawasaki--.

Column 1, line 14, delete "of".

Column 7, line 6, "wil" should be --will--.

*Signed and Sealed this*

*Seventh* Day of *February 1984*

[SEAL]

*Attest:*

*Attesting Officer*

GERALD J. MOSSINGHOFF

*Commissioner of Patents and Trademarks*